United States Patent
Itabashi

(10) Patent No.: US 8,655,612 B2
(45) Date of Patent: Feb. 18, 2014

(54) BATTERY MODEL IDENTIFICATION METHOD

(75) Inventor: Kinnosuke Itabashi, Kita-ku (JP)

(73) Assignee: Calsonic Kansei Corporation, Saitama-Ken (JP)

( * ) Notice: Subject to any disclaimer, the term of this patent is extended or adjusted under 35 U.S.C. 154(b) by 287 days.

(21) Appl. No.: 13/131,348

(22) PCT Filed: Nov. 12, 2009

(86) PCT No.: PCT/JP2009/069240
§ 371 (c)(1),
(2), (4) Date: May 26, 2011

(87) PCT Pub. No.: WO2010/064528
PCT Pub. Date: Jun. 10, 2010

(65) Prior Publication Data
US 2011/0231124 A1  Sep. 22, 2011

(30) Foreign Application Priority Data

Dec. 1, 2008  (JP) .................................. 2008-306665
Oct. 26, 2009  (JP) .................................. 2009-245263

(51) Int. Cl.
*G01R 31/36* (2006.01)

(52) U.S. Cl.
USPC ................. 702/63; 702/64; 702/65; 320/106

(58) Field of Classification Search
USPC ................. 702/63–65; 320/106; 340/636.1, 340/636.12–636.13, 636.15
See application file for complete search history.

(56) References Cited

U.S. PATENT DOCUMENTS

| 2004/0158418 A1 | 8/2004 | Kato et al. |
| 2008/0042701 A1* | 2/2008 | Weiss et al. ................... 327/143 |
| 2008/0206627 A1* | 8/2008 | Wright ............................ 429/93 |

FOREIGN PATENT DOCUMENTS

| JP | 3-210487 | 9/1991 |
| JP | 10-232273 | 9/1998 |
| JP | 2004-241325 | 8/2004 |
| JP | 2007-178215 | 7/2007 |

OTHER PUBLICATIONS

International Search Report issued Feb. 16, 2010 in International (PCT) Application No. PCT/JP2009/069240.

* cited by examiner

*Primary Examiner* — Mischita Henson
(74) *Attorney, Agent, or Firm* — Wenderoth, Lind & Ponack, L.L.P.

(57) ABSTRACT

In a battery model identification method of the present invention, an M-sequence input electric current production part inputs M-sequence signals with different frequency components as an electric current input into the battery. In this occasion, terminal voltage of the battery is measured by a voltage sensor, and a parameter estimation part executes system identification based on the measured result to calculate frequency characteristics of the battery. Resistance components and capacitance components as parameters of a battery model are identified based on the calculated frequency characteristics.

4 Claims, 8 Drawing Sheets

The Number of Shift Registe of M-sequence

| n | N | $a_1, a_2, \cdots, a_n$ |
|---|---|---|
| 2 | 3 | 11 |
| 3 | 7 | 101 |
| 4 | 15 | 1001 |
| 5 | 31 | 01001 |
| 6 | 63 | 100001 |
| 7 | 127 | 1000001 |
| 9 | 511 | 000100001 |
| 10 | 1023 | 0010000001 |
| 11 | 2047 | 01000000001 |
| 15 | 32767 | 100000000000001 |

| $(X_n = X_{n-3} + X_{n-1})$ | | | | | | | | |
|---|---|---|---|---|---|---|---|---|
| n | 0 | 1 | 2 | 3 | 4 | 5 | 6 | 7 | 8 |
| | 1 | 0 | 0 | 1 | 1 | 1 | 0 | 1 | 0 |
| | 1 | 0 | 0 | 1 | 1 | 1 | 0 | 1 | 0 |
| | 1 | 0 | 0 | 1 | 1 | 1 | 0 | 1 | 0 |
| | 1 | 0 | 0 | 1 | 1 | 1 | 0 | 1 | 0 |
| | 1 | 0 | 0 | 1 | 1 | 1 | 0 | 1 | 0 |
| | 1 | 0 | 0 | 1 | 1 | 1 | 0 | 1 | 0 |
| | 1 | 0 | 0 | 1 | 1 | 1 | 0 | 1 | 0 |

A

Minimum Time Width (Tm) = Clock Period

FIG. 13
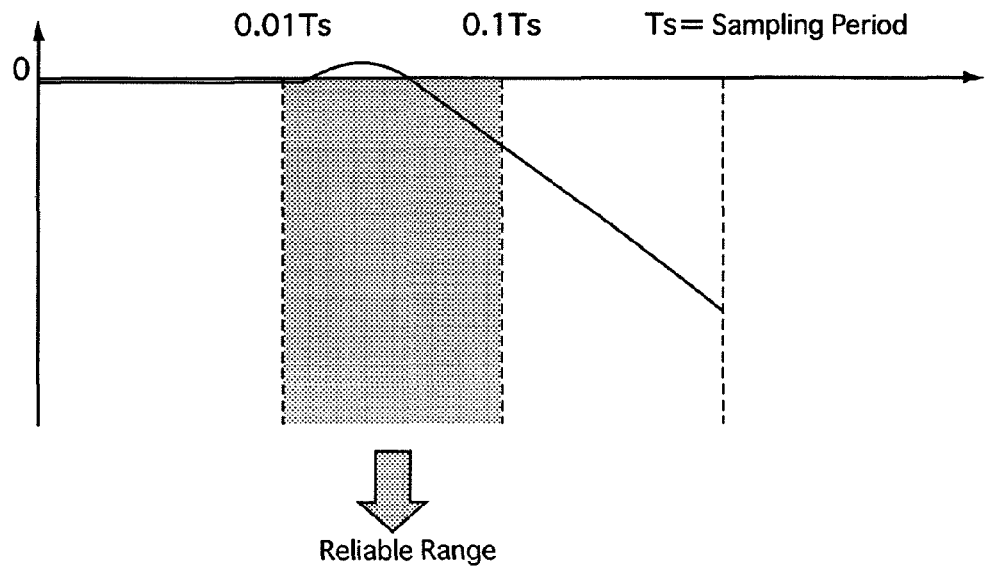
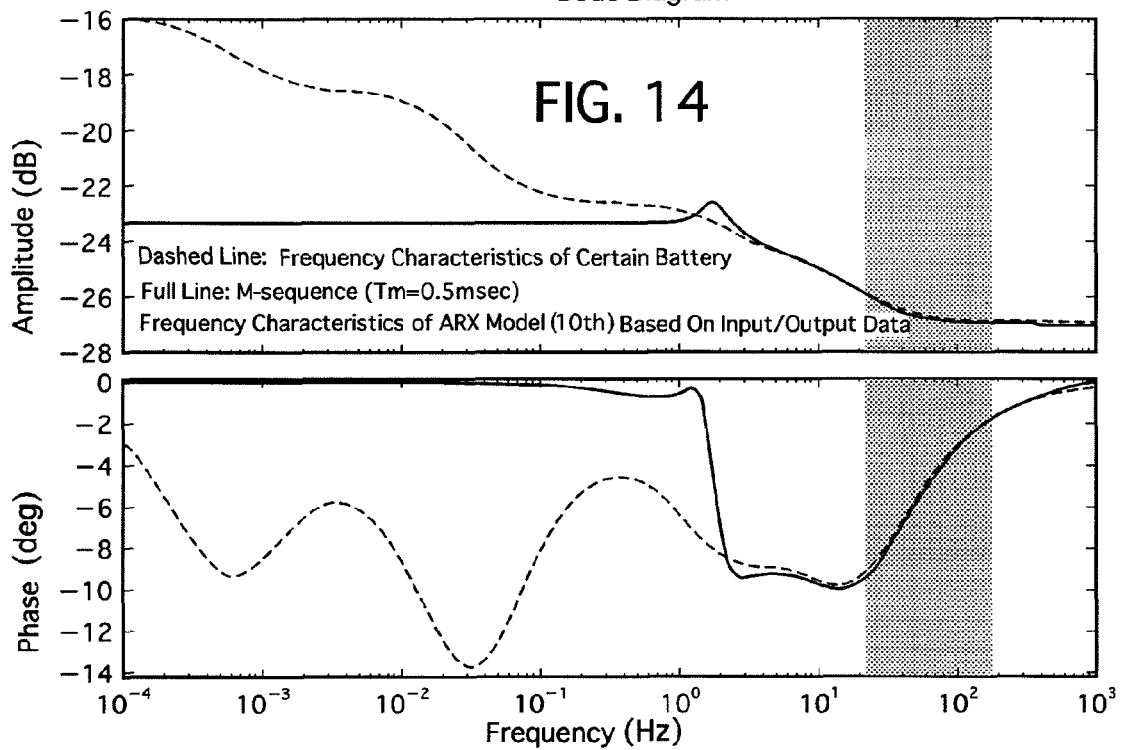
FIG. 14

BATTERY MODEL IDENTIFICATION METHOD

TECHNICAL FIELD

The present invention belongs to a technical field of a battery model identification method.

BACKGROUND OF THE INVENTION

In a conventional battery model identification method, in order to estimate SOC (State of Charge) of a battery, parameters of its battery model are identified based on frequency characters of the battery estimated using an alternating current impedance measurement method. (Refer to Patent Document 1 for example.)

Patent Document 1:

Japanese Patent Application Laid-Open Publication No. 2007-178215 (pages 2 to 17, especially the paragraphs [0069] to [0081], and all drawings)

DISCLOSURE OF THE INVENTION

Problem(S) to be Solved by the Invention

In the prior identification method of a battery model, there is, however, a problem in that it is different to identify the battery model because a state of the battery (the SOC for example) changes due to the measured of the under control of direct current in the alternating current impedance measurement where the impedance is measured varying the frequency of an input signal to be inputted to the battery.

The present invention is made focusing attention on the above-described problem, and its object is to provide a battery model identification method which can use an input signal with amplitude of an actually used signal and identify a battery model so that a state of the battery does not change.

Means for Solving the Problems

In order to achieve the object, in the present invention, a battery model identification method of a battery, which is capable of being discharged and charged, includes the steps of:

setting a battery model of the battery which has a plurality of resistance components and capacitance components as parameters;

inputting an electric current into the battery;

measuring a terminal voltage of the battery when the signal is inputted;

system-identifying the battery model based on the electric current inputted to the battery and a measured result of the terminal voltage;

calculating frequency characteristics of the battery; and estimating the parameters of the battery model based on the calculated frequency characteristics.

The electric current is produced by M-sequence signals with predetermined different frequency components. Sampling frequencies in a measuring of the terminal voltage are shifted according to a shift of the M-sequence signals. The battery model is system-identified by extracting and synthesizing data on respective frequency response in a predetermined frequency range, and system-identifying the battery model based on the data on the frequency response.

Effect of the Invention

Therefore, in the present invention, the battery model can be identified, using the input signal having an actually used amplitude, so that a state of the battery does not change.

BRIEF DESCRIPTION OF THE DRAWINGS

FIG. 13 is a diagram explaining a concept of a method for setting a reliable frequency range, which is used in a battery model identification method of a second embodiment according to the present invention;

FIG. 14 is a Bode diagram showing a relationship between the reliable frequency range and frequency characteristics obtained using the ARX model (tenth order) based on input data and output data of the M-sequence (clock period Tm=0.5 msec) in the battery model identification method of the second embodiment;

Figure 1:
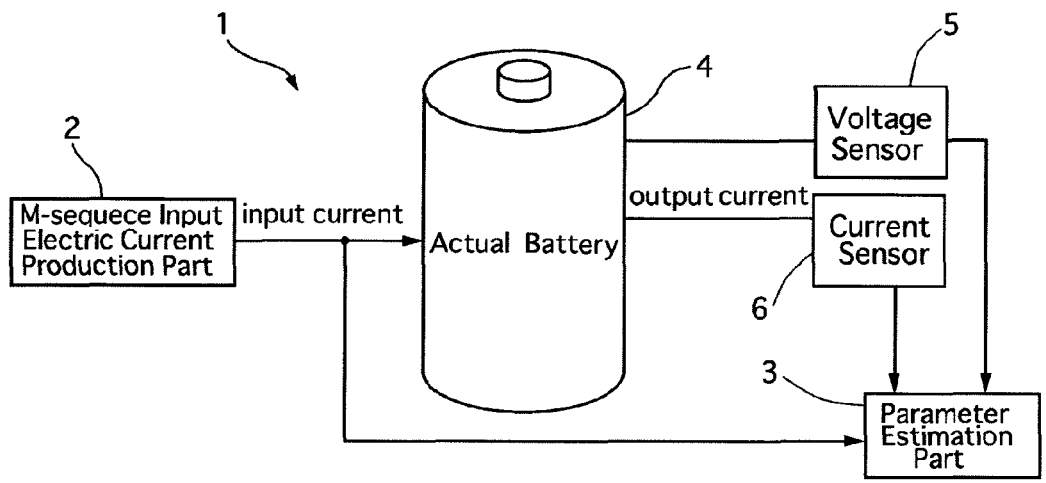
FIG. 1 is a block diagram showing a construction of a device for carrying out a battery model identification method of a first embodiment according to the present invention.

DESCRIPTION OF REFERENCE NUMBERS 1 battery model identification device
2 M-sequence input electric current production part
21 M-sequence producing circuit
211 register 212 adder
22 signal adjustment part
3 parameter estimation part
31 SOC calculation part
32 open circuit voltage calculation part
33 overvoltage calculation part
34 parameter calculation part
4 battery
5 voltage sensor
6 current sensor
7 battery model

BEST MODE FOR CARRYING OUT THE INVENTION

Hereinafter, the subject-matter of the present invention for realizing a battery model identification method will be explained based on the following embodiments.

First Embodiment

First, a construction of the battery model identification method of the first embodiment will be described.

FIG. 1 is a block diagram showing a construction of a device which carries out the battery model identification method of the first embodiment.

A battery model identification device 1 of the first embodiment is equipped with an M-sequence input electric current production part 2 and a parameter estimation part 3. Incidentally, a battery 4 is a secondary battery which is capable of being discharged and charged.

The M-sequence input electric current production part 2 produces an M-sequence signal having a predetermined electric current value to input the signal to the battery 4. This detail will be later described.

The parameter estimation part 3 estimates parameters of a battery model of the battery 4 based on output voltage to an input of the M-sequence signal and an electric current outputted from the battery 4.

In addition, it is equipped with a voltage sensor 5 for detecting a terminal voltage of the battery 4 and a current sensor 6 for detecting an output current of the battery 4.

Next, the battery model to be identified will be explained.

Figure 2:
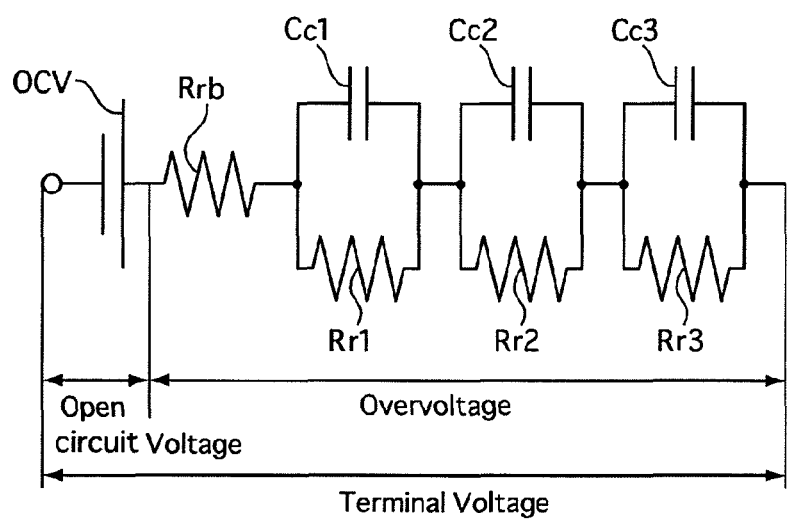
FIG. 2 is a diagram showing a battery model identified by the battery model identification device of the first embodiment.

FIG. 2 is a diagram explaining the battery model to be identified by the battery model identification device 1 which executes the battery model identification method of the first embodiment.

As shown in FIG. 2, the battery model 7 consists of an open circuit voltage OCV, a resister Rrb that sets a direct current component such as a electrolytic solution resistance and an ohmic resistance, a resistance Rr1 that sets as a reaction resistance representing a dynamic behavior in an electric charge transfer process of a lithium ion battery for example, an electric double layer capacitor Cc1 that sets as an electric double layer, reaction resistances Rr2 and Rr3 that set a representation of a dynamic behavior in a diffusion process, and electric double layer capacitor Cc2 and Cc3. Herein, the battery model 4 is represented by an equivalent circuit model of a first-order parallel circuit in the charge transfer process and a second-order parallel circuit in the diffusion process, and the order varies according to the situation.

Next, the M-sequence input electric current production part 2 will be in detail explained.

Figures 3, 4:
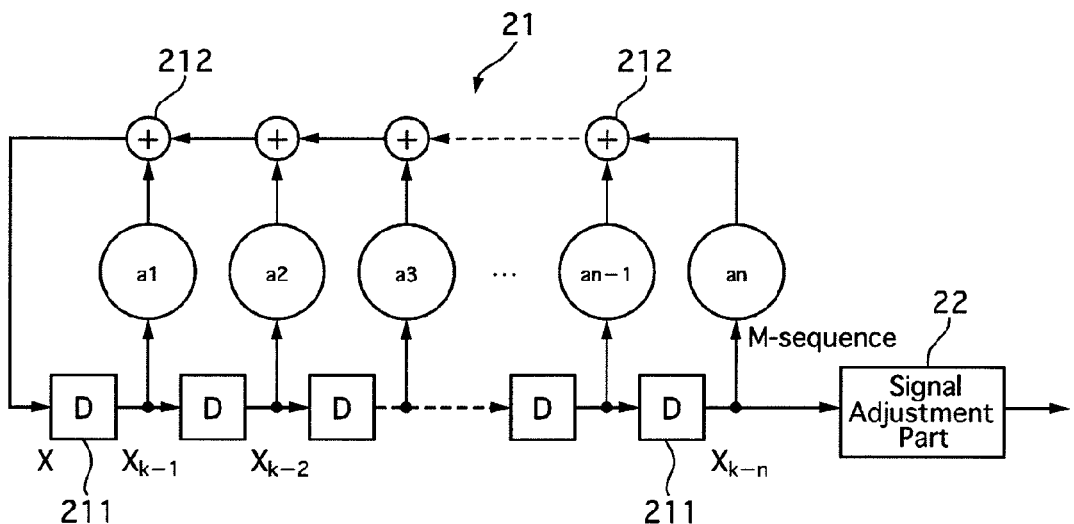
FIG. 3 is a diagram showing an M-sequence input electric current production part which is used in the battery model identification device of the first embodiment.
FIG. 4 is a table explaining the number of shift registers of the M-sequence production circuit shown in FIG. 3.

FIG. 3 is a diagram explaining the M-sequence input electric current production part 2 which is used in the battery model identification device 1 of the first embodiment. FIG. 4 is a table explaining the number of shift resisters of an M-sequence producing circuit.

The M-sequence input electric current production part 2 includes the M-sequence production circuit 21 and a signal adjustment part 22.

The M-sequence production circuit 21 is equipped with a plurality of D resisters 211 and adders 212. The D registers are coupled in series so that an output of an (n−1)-stage D register 212 is inputted to an n-stage D register 212 to execute calculation using a D-FF (Delay Flip-Flop) for example and output its results. A plurality of adders 212 are coupled in series to add the output of the respective D resister 211 and output of the subsequent D resister 211. The result is outputted to the subsequent adder 212.

Herein, the M-sequence will be explained.

Figures 5, 6:
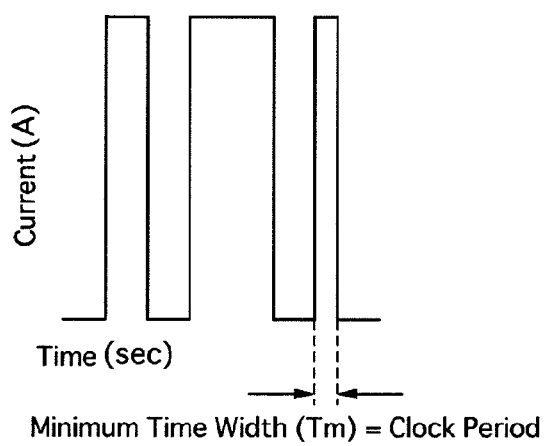
FIG. 5 is a table explaining an example of the M-sequence.
FIG. 6 is a partially enlarged diagram of the M-sequence signal.

FIG. 5 is a table explaining an example of the M-sequence. The M-sequence (Maximal length sequences) is a numeric sequence of 1 bit which is produced using the following linear recurrence equation.

$$X_n = X_{n-p} + X_{n-q} \quad (p > q) \qquad \text{<Equation 1>}$$

In this equation, the value of each term is 0 or 1, where symbol "+" represents exclusive logical addition. Accordingly, the ninth term is obtained by performing logical operations the XOR (Exclusive OR) of (n−p)th term and (n−q)th term. However, as q is always feed-backed to the last stage one, q=1. Representing generally, a period N of the M-sequence is represented by $N=2^P-1$.

FIG. 5 explains a case where P=3 and q=1 in the equation 1.

In FIG. 5, a range A indicated by an dashed line has 7 kinds of 3 bit patterns in all, where there is no pattern identical with another one. In other words, the M-sequence produces all of the p bit patterns only once. Elements in each pattern have two values of "0" and "1", and p bit provides $2^P$ patterns. However, the pattern where all of bits are 0 is removed because it means no production of signals.

That is, in FIG. 3, in the M-sequence production circuit 21 of the first embodiment, bit values at upstream and downstream sides of the D register 211 become values corresponding to the values from x to xk−n. Then, in the first embodiment, for example, 127 ways patterns are selected from the patterns shown in FIG. 4, and the number of the D register 211 is set to be 7.

Next, the signal adjustment part 22 will be described.

FIG. 6 is a partially enlarged diagram explaining the M-sequence signal.

Figure 7:
FIG. 7 is a diagram explaining the M-sequence signal.

FIG. 7 is a diagram explaining the M-sequence signal.

The signal adjustment part 22 adjusts a minimum unit of the M-sequence signal generated by the M-sequence production part 21 shown in FIG. 3 to a minimum time interval Tm, namely a clock period set according to its construction, as shown in FIG. 6. Then, as shown in FIG. 7, the M-sequence signal is adjusted to have a rectangular wave which repeats ON and OFF between +2(A) over and −2(A) over for example, and they are outputted to the battery 4 as an output of the M-sequence input electric current production part 2.

The M-sequence signal is a binary and quasi-white random signal, where the sum of + (ON) and − (OFF) becomes the same signal. Further, one set (one period) consists of a signal with 127 way ON widths.

Next, the parameter estimation part 3 will be in detail described.

Figure 8:
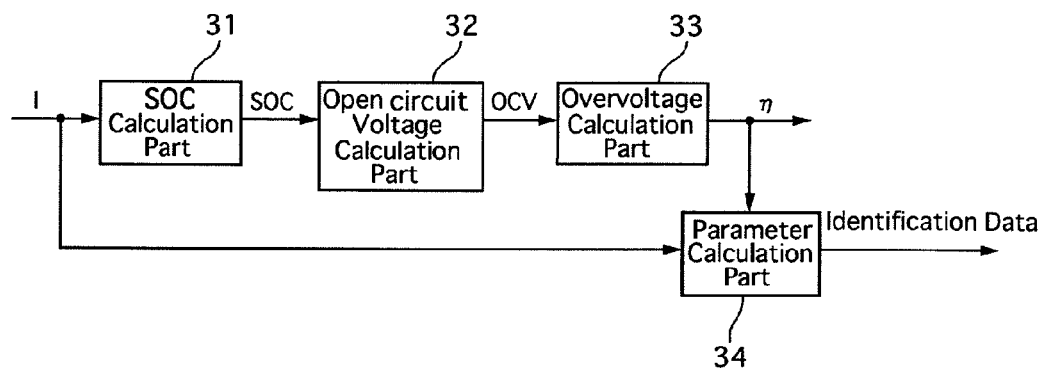
FIG. 8 is a block diagram showing a construction of a parameter estimation part which is used in the battery model identification device of the first embodiment.
Figure 9:
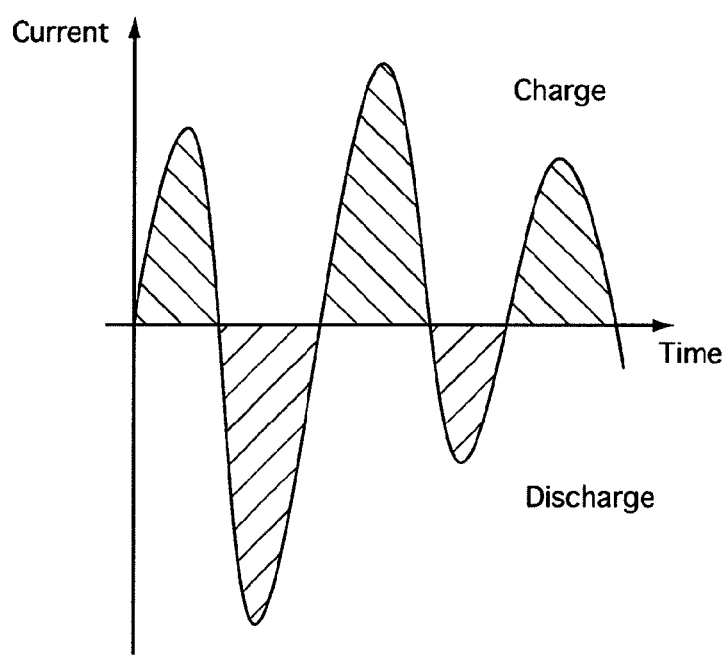
FIG. 9 is a diagram explaining a calculation state in an SOC calculation part which is used in the battery model identification device of the first embodiment.

FIG. 8 is a block diagram explaining a construction of the parameter estimation part 3. The parameter estimation part 3 includes an SOC calculation part 31, an open circuit voltage calculation part 32, an overvoltage calculation part 33 and a parameter calculation part 34. FIG. 9 is a diagram showing a calculation state in the SOC calculation part 31 shown in FIG. 8. The SOC calculation part 31 determines the SOC by accumulating electric current detected by the current sensor 6. Specifically, the SOC calculation part 31 determines the SOC by integrating the electric current and time when the battery 4 is repeated to be discharged and charged as shown in FIG. 9 for example.

Figure 10:
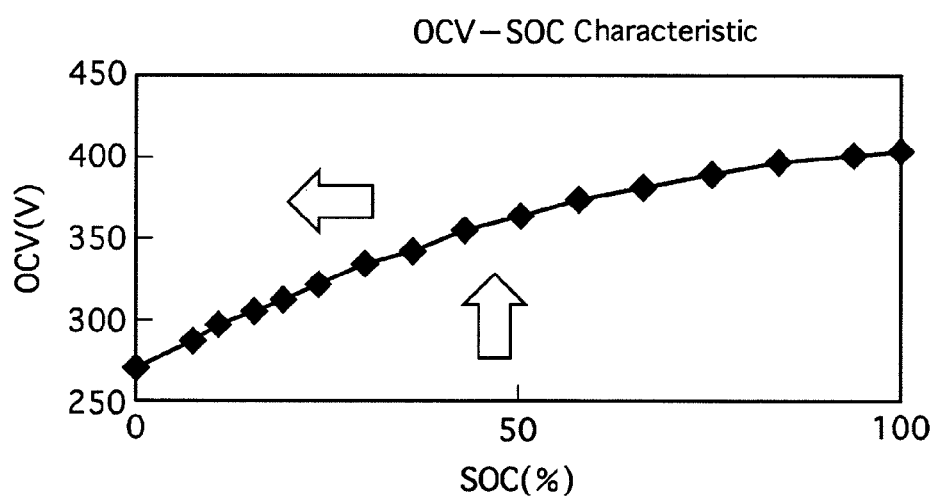
FIG. 10 is a graph showing a relationship between the SOC and OCV in the battery model identification device of the first embodiment.

FIG. 10 is a graph showing a relationship between the SOC and OCV (Open Circuit Voltage) in the battery model identification device 1 of the first embodiment. In FIG. 10, a range over a time axis represents a charge state, where a range under the time axis represents a discharge state. The open circuit voltage calculation part 32 measures a relationship between the SOC (%) and the OCV (V) in advance to store its date as shown in FIG. 10 for example, and it calculates the OCV (V) based on the SOC (%) obtained by the SOC calculation part 31, using the data.

On the other hand, the overvoltage calculation part 33 calculates the overvoltage by subtracting an open circuit voltage calculated by the open circuit voltage calculation part 32 from a terminal voltage of the battery detected by the voltage sensor 5. FIG. 2 shows a relationship between the terminal voltage, the open circuit voltage and overvoltage.

The parameter calculation part 34 respectively calculates parameters of the resistance component Rb of the direct current resistance Rrb, the resistance components R1-R3 of the reaction resistances Rr1-Rr3 and the capacitance components C1-C3 of condenser capacitances Cc1-Cc3.

The operation of the battery model identification method of the first embodiment will be described.

<Parameter Estimation Process>

Figure 11:
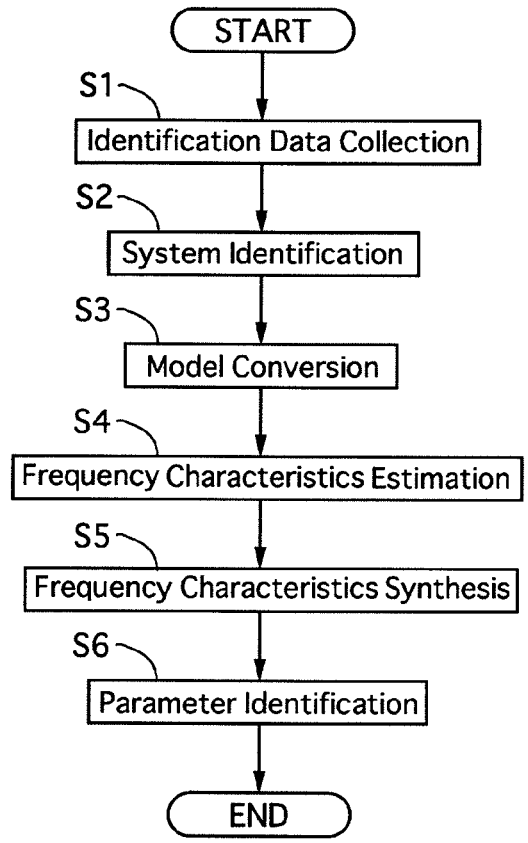
FIG. 11 is a flow chart showing a flow of a parameter estimation process which is carried out in the parameter estimation part shown in FIG. 8.

FIG. 11 is a flow chart showing a flow of a parameter estimation process that is carried out by the parameter calculation part 34, and hereinafter each step thereof will be explained.

At a step S1, the parameter calculation part 34 collects data for identification based on output voltage of the battery 4 when the M-sequence signal with different clock periods, which is given by the M-sequence input electric current production part 2, is inputted to the battery 4.

At a step S2, the system identification is executed based on the collected data for identification. It uses ARX model for example.

Figure 12:
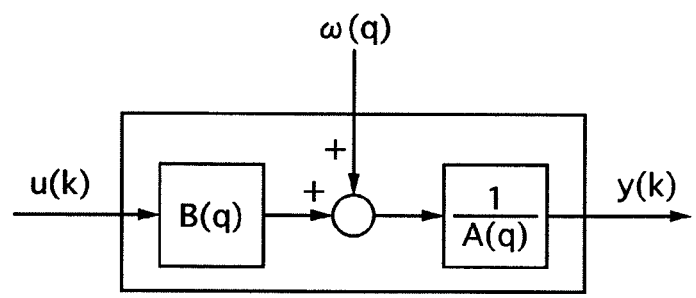
FIG. 12 is a diagram explaining an ARX model which is used in the parameter estimation part shown in FIG. 1 and identifies a system based on data on collected identification.

Herein, the ARX model (Auto-regressive exogeneous model) will be explained. FIG. 12 is a block diagram explaining the ARX model. First, a difference equation expressed by the following equation will be taken.

$$y(t)+a_1 y(t-1)+z+a_{na} y(t-na) = b_1 u(t-uk)+z+b_{nb} u(t-nk-nb+1) \quad \text{<Equation 2>}$$

This equation correlates a present output y(t) with finite numbers of past outputs y(t-k) and past inputs u(t-k). Thus, the construction of this model is defined by using three integer numbers na, nb and nk, where the argument na is the number of poles and the argument nb-1 is the number of zero points. On the other hand, the argument "nk" is a pure time delay (dead time) of the system. When no time delay occurs in a sampled-data control system, "nk" generally becomes to be 1. "nb" and "nk" become a range row vector in a multi-input system. Herein, the order and delay relates to i-th input.

Herein, the parameter vector is defined as follows.

$$\theta=[a_1, z a_{na}, b_1, z, b_{nb}] \quad \text{<Equation 3>}$$

And, the data vector is defined as follows.

$$\varphi=[-y(k-1), z-y(k-n_a), u(k-1), z, u(k-n_b)]^T \quad \text{<Equation 4>}$$

Then, the output y(k) can be represented by the following equation, where ω is a white noise.

$$y(k)=\theta^T \varphi(k)+\omega(k) \quad \text{<Equation 5>}$$

Further, two polynomial equations are defined.

$$A(q)=1+a_1 q^{-1}+z+a_{na} q^{-na} \quad \text{<Equation 6>}$$

$$B(q)=1+b_1 q_{-1}+z+b_{nb} q^{-nb} \quad \text{<Equation 7>}$$

Then, the ARX model is represented as follows.

$$A(q)y(k)=B(q)u+\omega(k) \quad \text{<Equation 8>}$$

At a step S3, a discrete-time LTI identification model obtained at the step S2 is converted into a continuous time LTI model. Incidentally, the LTI model is a linear time-invariant model. Therefore, the characteristic to continuous time axis can be estimated.

At a step S4, the frequency characteristics of the continuous time LTI model obtained at the step S3 are estimated. In the battery model identification method of the first embodiment, the estimation using Bode diagram and the estimation using Nyquist diagram are carried out.

At a step S5, two frequency characteristic diagrams obtained from the results at the step S4 are synthesized in a reliable frequency range.

At a step S6, the parameter estimation is executed based on the synthesized frequency characteristics by using curve fitting. The contents of this process is similar to a process in which the reaction resistances Rr1-Rr3 and condenser capacitances Cc1-Cc3 as alternating current circuit constants are obtained from a plotted wave of the real axis component and the an imaginary axis component of the impedance as described in Japanese Patent Laid-Open Publication No. 2007-178215.

<Operation to Stabilize SOC and Execute Parameter Estimation>

In the battery model identification method of the first embodiment, the M-sequence signal, which is produced by the M-sequence input electric current production part 2, is inputted into the battery 4, and the parameter estimation part 3 executes the processes at the steps S1 to S6, so that the parameters are estimated. The M-sequence signal, which is produced by the M-sequence input electric current production part 2 and inputted into the battery 4, is a rectangular shaped signal in which has almost the same value as actual value and plus and minus are the same. For example, it is the rectangular shaped wave with +2(A) over and -2(A) over as shown in FIG. 7. Therefore, the estimation can be executed without varying a state of the actual battery (in one period).

Further, the M-sequence signal is measured by 127 way ON widths for example, namely by frequency, and the value of the frequency is easy to be comprehended by obtaining the values of the respective part of the M-sequence production circuit 21. Therefore, its process becomes easy, and a brief desired measurement can be easily carried out. Therefore, the Bode diagram and the Nyquist diagram can be easily obtained. In addition, the kind of the frequency may be increased or decreased according to need, with reference to FIG. 4.

Further, as the M-sequence signal is the binary and quasi-white random signal and the sum of plus values and the sum of minus values are the same, the current to be charged and the current to be discharged are the same. Accordingly, the value of SOC is in a stable and not-varying state in one period of 127 way ON widths for example.

The internal resistance of the battery 4 varies according to the value of SOC of the battery 4, while, in the first embodiment, it is measured maintaining the SOC value to have a not-varying and stable value. This provides a nice identification of the battery model.

Further, in the battery model identification method of the first embodiment, as shown in FIG. 2, the battery model is represented by the resistance Rrb setting the direct current component of the electrolyte resistances, the ohm's resistances and the like, the resistance Rr1 setting the reaction resistance representing the dynamic behavior in the charge transfer process, the capacitance Cc11 setting the electric double layer, the resistances Rr2 and Rr3 setting the dynamic behavior in the diffusional process, and the capacitances Cc2 and Cc3. The open circuit voltage OCV and the overvoltage component are separated from each other, and then the resistance components and the condenser capacitance components as parameters are identified.

The overvoltage η is obtained from the following relationship.

That is, the open circuit voltage OCV=the terminal voltage V−the overvoltage η (refer to FIG. 2). Chemical reaction including various elementary step reactions occurs in the battery 4, which allows the chemical reaction to be separated. Therefore, a detailed equivalent circuit model can be constructed by segmentalizing its frequency characteristics.

This overvoltage η is obtained separating from the system identification at to the Step S3. Specifically, the SOC calculation part 31 calculates the SOC based on the integral value of the electric current, and the open circuit voltage calculation part 32 calculates the open circuit voltage OCV based on the SOC. Then the overvoltage calculation part 33 calculates the overvoltage η, so that the estimated parameters approach real values.

The parameters of the battery model (equivalent circuit) are obtained as follows. The system identification is executed using the ARX model (at the step S2) based on the collected data as the response of the voltage of the battery 4 to the M-sequence signal (at the step S1). The results obtained by the system identification at the step S2 are the discrete system, and it is converted into the continuous system in order to obtain the Bode diagram and the Nyquist diagram (at the step S3). The Bode diagram and the Nyquist diagram are generated as the estimation of the frequency characteristics (at the step S4). Preferably, a reliable frequency range is obtained through the two diagrams, and the frequency characteristics are synthesized in this frequency range (at the Step S5). Then the resistance components R1-R3 and the capacitance components C1-C3, which are the parameters of the battery model (equivalent circuit), are calculated based on the synthesized frequency characteristics (at the step S6). The direct current resistance component Rb can be easily obtained from the estimated parameters and the overvoltage η.

The further explanation will be added as follows in order to more clarify the operation of the battery model identification method of the first embodiment.

In order to calculate the frequency characteristics of the battery and identify the parameters of the battery model, it is possible to use the alternating current impedance measurement. The chemical reaction of the battery has respective peculiar response time, so that the chemical reaction including various elementary step reactions can be separated using the alternating current impedance measurement. The alternating current impedance measurement is a method for estimating the frequency response based on the measurement of impedances when the frequency characteristics of input signal are only varied and inputted into the battery. The method, for constructing an equivalent circuit model based on the frequency response obtained using the alternating current impedance method, has been used.

However, it is difficult to construct a stable equivalent circuit model by using the alternating current impedance method in which the direct current control is needed because the state of charge (SOC) of the battery changes due to discharge and charge.

Compared with this, in the battery model identification method of the first embodiment, the M-sequence signal of the quasi-white random signal is inputted into the battery 4, so that it is advantageous in constructing the equivalent circuit model after estimating the frequency response of the battery which is closer to real one.

Next, the effects of the battery model identification method of the first embodiment will be described. The battery model identification method of the first embodiment has effects listed below.

(1) In the battery model identification method of the battery that is capable of discharged and charged, the battery model 7 is set to have a plurality of resistance components and capacitances in the battery as parameters thereof, and the M-sequence input electric current production part 2 inputs the M-sequence signal with different frequency components as a current input into the battery 4. At that time, the voltage sensor 5 measures the terminal voltage of the battery, and the parameter estimation part 3 executes the system identification based on the measured result to calculate the frequency characteristics of the battery based on the calculated frequency characteristics, and estimate the resistance components R1-R3 and the capacitance components C1-C3 as the parameters of the battery model 7 based on the calculated frequency characteristics. Therefore, the identification of the battery model can be executed without changing the state of battery, using the input signal having the real value.

(2) In the construction of the above (1), the system identification is executed in such a way that the SOC calculation part 31 calculates the SOC by integrating the output current of the battery and the overvoltage calculation part 33 calculates the overvoltage by subtracting the open circuit voltage from the terminal voltage of the battery. Therefore, as the chemical reaction including various primary step reactions occurs in the battery 4, the chemical reaction can be separated to segmentalize the frequency characteristics and construct a detailed equivalent circuit model.

Second Embodiment

Next, a second embodiment of the present invention will be explained. Its basic construction is the same as that of the first embodiment, and only different part will be explained.

In order to estimate the parameters by using the battery model identification method of the first embodiment, the discrete system is converted into the continuous system (at the step S3), the Bode diagram and the Nyquist diagram are generated to estimate the frequency characteristics (at the step S4), the frequency characteristics are synthesized in the reliable frequency range by using the two diagram (at the step S5), and the parameters are estimated using the curve fitting (at the step S6).

Compared with this, in the battery model identification method of the second embodiment, there is a difference in that data on the frequency response in the reliable frequency range to the respective sampled frequency is extracted, and the parameters of the equivalent circuit model are calculated using the data on the frequency response in which the data in each reliable frequency range is synthesized.

The steps 1 and 2 are the same as those of the first embodiment, and accordingly only different steps will be explained. Specifically, the steps S3 and S4 in the first embodiment are respectively replaced by steps S3' and S4', which will be described below, in the second embodiment.

At the step S3', the data on the frequency response in the reliable frequency range to the respective sampled frequency is extracted and synthesized. Herein, the reliable frequency range is a frequency range that has power in a certain frequency range. This is determined based on input power spectrum, sampling period and others of the produced input signal. In addition, it depends on an identification method.

A concrete example of the method for setting the reliable frequency range will be presented. FIG. 13 is a characteristic diagram showing a relationship between sampling frequency (Ts) and the reliable frequency range. As explained about the battery model identification method of the first embodiment, it is assumed that a clock period (Tm) is set 0.5 msec and the sampling period uses the equivalent value of the clock period (Tm) in the M-sequence signal production method. As the input employs the M-sequence as the binary and quasi-white noise signal, a certain range is white noise. In addition, in a case where the system identification is executed with the use of a least-square method like ARX for example, the frequency range where system identification can be executed with a high degree of accuracy is 10 to 100 times wider. Accordingly, as shown in FIG. 13, the reliable frequency range is set to be the range $1/100$ to $1/10$ times as wide as sampling that sets the reliable frequency range (range with strong power).

In a case where the reliable frequency range is set by such a method, an example is shown below as a method for producing an equivalent circuit model by executing the system identification of a plant with wide time constant such as that of a battery, First, the data on the input and the output is determined: the input is tenth order M-sequence input signal (input is current in this case) with the clock period (Tm) 0.5 msec, and the output is terminal voltage (or may be overvoltage) that is outputted from a certain battery plant when the input is inputted. Then the ARX (tenth order) executes the system identification using the equivalent value of the clock period (Tm) of the M-sequence as the sampling period.

FIG. 14 is a Bode diagram showing the frequency characteristics of the model constructed using the system identification of the second embodiment and the frequency characteristics of the battery plant. In FIG. 14, the dashed line indicates the frequency characteristics of the certain battery plant, and the full line indicates the frequency characteristics calculated through the ARX model (tenth order) using the data on input and output in the M-sequence (Tm=0.5 msec). The reliable frequency range is an area (corresponding to the hatched area in FIG. 14) $1/100$ to $1/10$ times as wide as the set sampling frequency (Ts).

Figure 15:
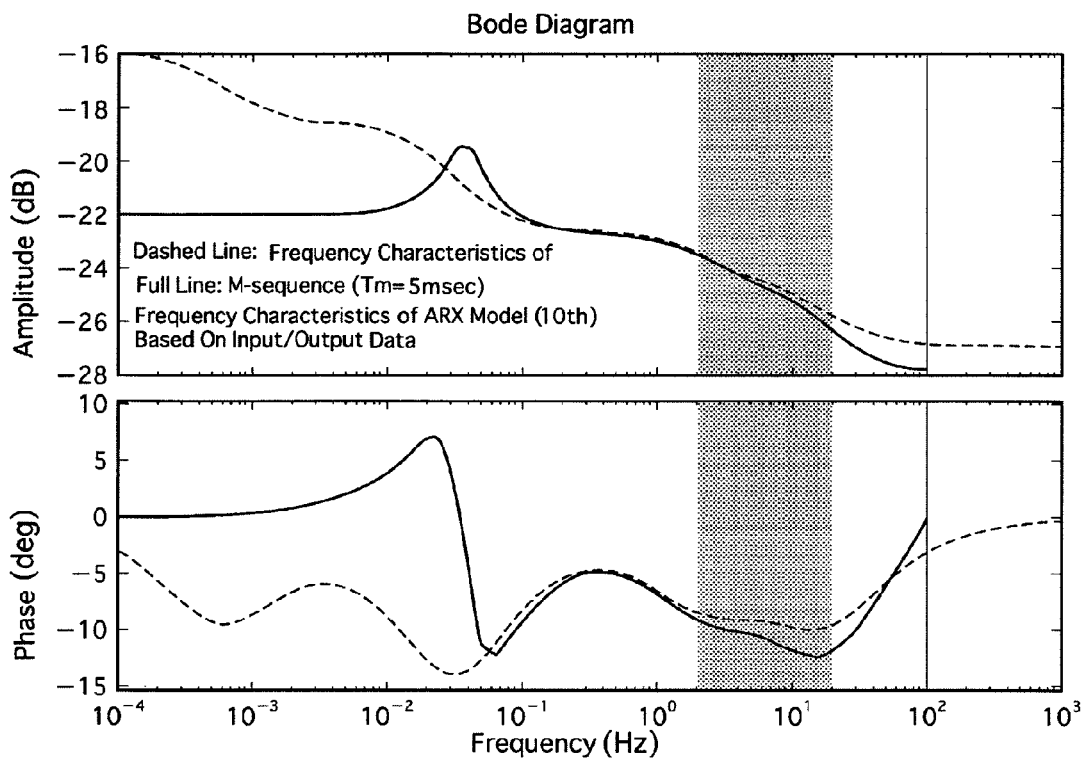
FIG. 15 is a Bode diagram showing a relationship between the reliable frequency range and the frequency characteristics obtained using the ARX model (tenth order) based on input data and output data of the M-sequence (clock period Tm=5 msec) in the battery model identification method of the second embodiment.

Next, in a case where the range to be focused is set to be 2 to 20 Hz, the clock period (Tm) (=sampling period) of the M-sequence is set to be 5 msec and the system is identified through the ARX similarly. FIG. 15 is the Bode diagram showing the frequency characteristics of the model constructed using the system identification of the second embodiment and the frequency characteristics of the battery plant.

In FIG. 15, the dashed line indicates the frequency characteristics of the certain battery plant, and the full line indicates the frequency characteristics calculated through the ARX model (tenth order) using the data on input and output in the M-sequence (Tm=5 msec). The reliable frequency range is an area (corresponding to the hatched area in FIG. 15) $1/100$ to $1/10$ times as wide as the set sampling frequency (Ts), similarly to the case where the clock period (Tm) is set to be 0.5 msec. In addition, only the frequency response data in the reliable frequency range are extracted and combined to use as the reliable data. Thus the frequency response data of a plant containing wide time constant such as a battery is obtained with a high degree of accuracy.

At a step S4', the system identification is executed using the frequency response data obtained and combined at the step S3', and the transfer function is produced. Then the resistance components Rb and R1-R3 and the capacitance components C1-C3 as the parameters of the equivalent circuit model are calculated by comparing the coefficients.

In the battery model identification method of the second embodiment, not executing the parameter estimation using the Nyquist diagram and the curve fitting like in the first embodiment, the transfer function is produced based on the frequency characteristics obtained from synthesis of the reliable ranges, and the parameters are estimated based on the transfer function. Therefore, subjective elements can be eliminated when a figural characteristic is picked out in the curve fitting, and accordingly the parameter can be estimated with a high degree of accuracy.

As described above, the battery model identification method of the present invention has been explained based on the first and second embodiments, and its concrete construction is not limited to these embodiments, design changes, addition and the like may be contained as long as they do not depart from the subject-matter of the invention of each claim.

For example, both of estimation using the Bode diagram and the Nyquist diagram are carried out and they are synthesized, but only one of them may be used. In addition, the model employs the ARX model, but it may be other models.

Figure 16:
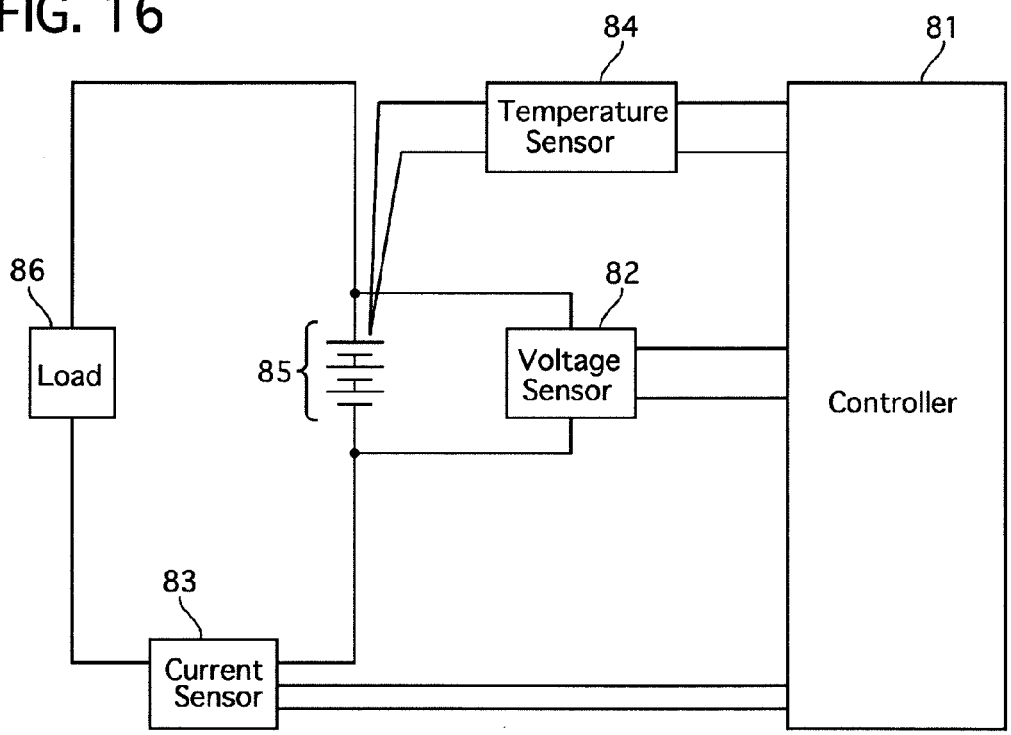
FIG. 16 is a diagram showing a construction of a battery system to which the battery model identification method of the first embodiment can be applied.

Further, the battery model identification method of the first embodiment may be a method used for a construction shown in FIG. 16. FIG. 16 is a diagram showing a construction of a battery system. The battery system shown in FIG. 16 is equipped with a controller 81, a voltage sensor 82, a current sensor 83, a temperature sensor 84, a battery 85 and a load 86. The controller 81 controls discharge and charge of the battery 85 based on the values detected by the respective sensors. The controller 81 calculates the SOC and others, and it controls based on the SOC, the value using the SOC or others. It is difficult to directly measure the values calculated based on the sensed values, and accordingly they are estimated by calculation and the controller 81 need to execute the control based on the estimated values. The battery model identification method of the first embodiment may be used to calculate the estimated values. In this case, the accuracy of the estimation is improved, and the battery 85 can be operated in high efficiency.

The invention claimed is:

1. A battery model identification method of a battery capable of being discharged and charged, the method comprising the steps of:
    setting parameters of a battery model of the battery, the parameters of the battery model including a plurality of resistance components and capacitance components;
    inputting an electric current into the battery;
    measuring a terminal voltage of the battery when the electric current is inputted;
    system-identifying the battery model based on the electric current inputted to the battery and the measured terminal voltage;
    calculating frequency characteristics of the battery; and
    estimating the parameters of the battery model based on the calculated frequency characteristics of the battery, wherein the electric current is produced by M-sequence signals with predetermined different frequency components, wherein sampling frequencies utilized in said measuring of the terminal voltage are shifted according to a shift of the M-sequence signals, and wherein said system-identifying of the battery model identifies the battery model (i) by extracting and synthesizing data on respective frequency responses in a predetermined frequency range and (ii) based on the data on the respective frequency responses.

2. The battery model identification method according to claim 1, further comprising the steps of:

calculating a state of charge (SOC) by accumulating an output current of the battery;

calculating open circuit voltage based on the SOC;

calculating overvoltage by subtracting the open circuit voltage from the terminal voltage of the battery; and system-identifying the battery model using the overvoltage.

3. The battery model identification method according to claim 1, wherein the M-sequence signals are set such that (i) a set clock period of the M-sequence signals and a set sampling frequency have the same values and (ii) the predetermined frequency range of the M-sequence signals is set to be $1/100$ to $1/10$ times as wide as the set sampling frequency.

4. The battery model identification method according to claim 2, wherein the M-sequence signals are set such that (i) a set clock period of the M-sequence signals and a set sampling frequency have the same values and (ii) the predetermined frequency range of the M-sequence signals is set to be $1/100$ to $1/10$ times as wide as the set sampling frequency.

* * * * *